United States Patent
Nagy et al.

(10) Patent No.: US 9,806,159 B2
(45) Date of Patent: Oct. 31, 2017

(54) TUNED SEMICONDUCTOR AMPLIFIER

(71) Applicant: M/A-COM Technology Solutions Holdings, Inc., Lowell, MA (US)

(72) Inventors: Walter H. Nagy, Raleigh, NC (US); Lyndon Pattison, Newtownabbey (IE)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 14/878,952

(22) Filed: Oct. 8, 2015

(65) Prior Publication Data

US 2017/0104073 A1    Apr. 13, 2017

(51) Int. Cl.
| | |
|---|---|
| H01L 29/20 | (2006.01) |
| H01L 27/088 | (2006.01) |
| H03H 11/28 | (2006.01) |
| H01L 49/02 | (2006.01) |
| H01L 29/778 | (2006.01) |
| H01L 29/267 | (2006.01) |
| H01L 23/528 | (2006.01) |
| H01L 23/532 | (2006.01) |

(52) U.S. Cl.
CPC ........ *H01L 29/2003* (2013.01); *H01L 23/528* (2013.01); *H01L 23/53242* (2013.01); *H01L 27/088* (2013.01); *H01L 28/60* (2013.01); *H01L 29/267* (2013.01); *H01L 29/778* (2013.01); *H03H 11/28* (2013.01)

(58) Field of Classification Search
CPC ............... H01L 29/2003; H01L 23/528; H01L 23/53242; H01L 27/088; H01L 28/60; H01L 29/267; H01L 29/778; H03H 11/28

USPC ......................................................... 333/32
See application file for complete search history.

(56) References Cited

U.S. PATENT DOCUMENTS

| | | |
|---|---|---|
| 7,071,498 B2 | 7/2006 | Johnson et al. |
| 7,135,720 B2 | 11/2006 | Nagy et al. |
| 7,247,889 B2 | 7/2007 | Hanson et al. |
| 9,064,775 B2 | 6/2015 | Weeks, Jr. et al. |
| 2008/0315392 A1* | 12/2008 | Farrell ............. H01L 23/66 257/691 |

(Continued)

FOREIGN PATENT DOCUMENTS

| | | |
|---|---|---|
| EP | 1750298 A2 | 2/2007 |
| EP | 16190615.1 | 3/2017 |

OTHER PUBLICATIONS

U.S. Appl. No. 15/257,736, filed Sep. 6, 2016, Nagy et al.

(Continued)

*Primary Examiner* — Stephen E Jones
*Assistant Examiner* — Scott S Outten
(74) *Attorney, Agent, or Firm* — Wolf, Greenfield & Sacks, P.C.

(57) ABSTRACT

Methods and structures for improving the performance of integrated semiconductor transistors operating at high frequency and/or high power are described. Two capacitors may be connected to an input of a semiconductor transistor and tuned to suppress second-harmonic generation and to transform and match the input impedance of the device. A two-stage tuning procedure is described. The transistor may comprise gallium nitride and may be configured as a power transistor capable of handling up to 1000 W of power. A tuned transistor may operate at frequencies up to 6 GHz with a peak drain efficiency greater than 60%.

34 Claims, 9 Drawing Sheets

(56) References Cited

U.S. PATENT DOCUMENTS

2011/0148529 A1    6/2011    Besling et al.
2011/0298535 A1   12/2011   Van Rijs et al.
2016/0086878 A1*   3/2016   Otremba ............ H01L 27/0629
                                                           257/139

OTHER PUBLICATIONS

Extended European Search Report for Application No. EP 16190615.1 dated Mar. 8, 2017.

[No Author Listed], Gallium Nitride 48V, 100W, DC-2.2 GHz HEMT: Built Using the SIGANTIC Process—A proprietary GaN-on-Silicon technology. Nitronex. NPT2010. 2013. Accessed Feb. 23, 2017. 1-10.

[No Author Listed], GaN Wideband Transistor 48 V, 50 W DC-3.5 GHZ. Macom Technology Solutions Inc. NPT2020. Accessed Feb. 23, 2017. Available at: https://cdn.macom.com/datasheets/NPT2020.pdf. 13 pages.

Jantarachote et al., Frequency band and operating class reconfigurable GaN HEMT power amplifier for sustainable wireless communications and energy applications. The 20th Asia-Pacific Conference on Communication (APCC). 2014: 156-60.

Victor et al., Voltage controlled GaN-on-Si HFET power oscillator using thin-film ferroelectric varactor tuning. Proceedings of the 36th European Microwave Conference. Sep. 2006; 87-90.

\* cited by examiner

US 9,806,159 B2

TUNED SEMICONDUCTOR AMPLIFIER

BACKGROUND

Technical Field

The technology relates to high-speed, high-power semiconductor transistors and amplifiers constructed from such transistors.

Discussion of the Related Art

Gallium nitride semiconductor material has received appreciable attention in recent years because of its desirable electronic and electro-optical properties. GaN has a wide, direct bandgap of about 3.4 eV that corresponds to the blue wavelength region of the visible spectrum. Light-emitting diodes (LEDs) and laser diodes (LDs) based on GaN and its alloys have been developed and are commercially available. These devices can emit visible light ranging from the violet to red regions of the visible spectrum.

Because of its wide bandgap, GaN is more resistant to avalanche breakdown and can maintain electrical performance at higher temperatures than other semiconductors, such as silicon. GaN also has a higher carrier saturation velocity compared to silicon. Additionally, GaN has a Wurtzite crystal structure, is a very stable and hard material, has a high thermal conductivity, and has a much higher melting point than other conventional semiconductors such as silicon, germanium, and gallium arsenide. Accordingly, GaN is useful for high-speed, high-voltage, and high-power applications. For example, gallium-nitride materials are useful in semiconductor amplifiers for radio-frequency (RF) communications, radar, RF energy, and microwave applications.

Applications supporting mobile communications and wireless internet access under current and proposed communication standards, such as WiMax, 4G, and 5G, can place austere performance demands on RF power transistors. These transistors may need to meet performance specifications related to output power, signal linearity, signal gain, bandwidth and efficiency.

SUMMARY

Methods and structures for improving the performance of high-speed, high-power, semiconductor transistors are described. The transistors may comprise gallium-nitride material in some embodiments, though other semiconductor materials may be used on other embodiments. In some implementations, the transistors may be formed from one or more layers of gallium nitride semiconductor material deposited on a substrate of a different material. On-chip circuitry may be included to tune the performance of the device to suppress second harmonic generation and match an input impedance of the device. According to some embodiments, a two-capacitor input network is incorporated into a transistor package to improve the performance of the device.

In some embodiments, a method for tuning a semiconductor transistor having a two-capacitor input network may comprise acts of altering a value of a first capacitor in a first capacitive shunt until a resonance loop of an $S_{11}$ scattering-parameter curve for the transistor has a peak at a frequency that is approximately twice a target frequency for the semiconductor transistor. The first capacitive shunt may be connected to at least one gate contact of the semiconductor transistor. A method for tuning the semiconductor transistor may further include altering a value of a second capacitor in a second capacitive shunt until an input impedance at an input to the second capacitive shunt is approximately equal to a target impedance value. The second capacitive shunt may be added to the first capacitive shunt after the value of the first capacitor has been altered.

In some aspects, the semiconductor transistor may comprise gallium nitride in an active region of the transistor. The target frequency may be between approximately 1 GHz and approximately 6 GHz. According to some implementations, altering the value of the first capacitor may comprise selecting a value of the first capacitor in a range between approximately 5 pF and approximately 60 pF. In some aspects, altering the value of the second capacitor may comprise selecting a value of the second capacitor in a range between approximately 10 pF and approximately 50 pF.

According to some implementations, the $S_{11}$ scattering-parameter curve is determined looking into the first capacitive shunt toward the semiconductor transistor. In some aspects, the $S_{11}$ scattering-parameter curve is determined by numerical simulation. In some implementations, the $S_{11}$ scattering-parameter curve includes the effect of gate-to-source capacitance $C_{gs}$.

According to some implementations, a method for tuning a semiconductor transistor may further include connecting an electrode of the first capacitor to gate pads of the semiconductor transistor with a plurality of bond wire connections. In some aspects, the first capacitor is a bar capacitor. In some implementations, a method further includes connecting an electrode of the second capacitor to an electrode of the first capacitor with a plurality of bond wires. A method may also include connecting the electrode of the second capacitor to a package gate lead. In some aspects, the second capacitor is a bar capacitor. A method for tuning a semiconductor transistor may further include acts of selecting a first value for the first capacitor, selecting a second value for the second capacitor, and assembling the semiconductor transistor in a package with a first capacitor having the first value and a second capacitor having the second value.

In some implementations, a target impedance value for a tuned semiconductor transistor includes between 0 ohms and 100 ohms of real impedance. In some aspects, the semiconductor transistor comprises one or more depletion-mode transistors disposed in a linear array on a semiconductor die.

The foregoing implementations, features, and aspects may be included in an embodiment of a method for tuning a semiconductor transistor in any suitable combination.

In some embodiments, a tuned semiconductor transistor may comprise a first capacitive shunt connected to at least one gate contact of the semiconductor transistor and a second capacitive shunt connected to the first capacitive shunt, wherein a peak of a resonance loop for an $S_{11}$ scattering-parameter curve determined at the first capacitive shunt looking toward the semiconductor transistor and with the second capacitive shunt disconnected is at a frequency that is approximately twice a target frequency for the semiconductor transistor.

In some aspects, the semiconductor transistor comprises one or more gallium-nitride transistors integrated onto a die. The one or more gallium-nitride transistors may be arranged in a linear array. In some cases, the one or more gallium-nitride transistors comprise depletion-mode transistors. According to some aspects, the one or more gallium-nitride transistors comprise high-electron-mobility transistors. In some implementations, the one or more gallium-nitride transistors are arranged in a linear array and a power density rating per unit length for the semiconductor transistor is between approximately 1 W/mm and approximately 15

W/mm. In some aspects, the one or more gallium-nitride transistors include a gallium-nitride layer formed over a silicon substrate. According to some implementations, a drain efficiency at the target frequency for a tuned semiconductor transistor is between approximately 50% and approximately 80%.

In some implementations, a tuned semiconductor transistor may comprise at least one transition layer formed between the silicon substrate and the gallium-nitride layer. In some aspects, the first capacitive shunt may comprise a first bar capacitor having a capacitance between approximately 5 pF and approximately 60 pF and a first plurality of bond wires connected between an electrode of the first bar capacitor and gate pads of the one or more transistors. The bond wires may be formed of gold and may be spaced between approximately 100 microns and approximately 500 microns apart. In some cases, the second capacitive shunt comprises a second bar capacitor having a capacitance between approximately 5 pF and approximately 60 pF and a second plurality of bond wires connected between an electrode of the second bar capacitor and an electrode of the first bar capacitor. The first and second plurality of bond wires may be formed of gold and may be spaced between approximately 100 microns and approximately 500 microns apart.

According to some aspects, a tuned semiconductor transistor may further comprise a package housing the semiconductor transistor and the first and second capacitive shunts. The package may include a metal lead connected to the second capacitive shunt that provides a gate connection to the at least one gate contact of the transistor. In some implementations, the package may comprise a ceramic air-cavity, a plastic air-cavity, or plastic over-mold package. In some aspects, a real input impedance for the semiconductor transistor is between 0 ohms and approximately 100 ohms. A target frequency for the transistor may be between approximately 1 GHz and approximately 6 GHz. In some cases, a plurality of tuned semiconductor transistors may be assembled on a circuit board to operate in parallel as a single power transistor.

The foregoing apparatus and method embodiments may be included in any suitable combination with aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabricated circuits, only one device and/or circuit may be shown to simplify the drawings. In practice, a large number of devices or circuits may be fabricated in parallel across a large area of a substrate or entire substrate. Additionally, a depicted device or circuit may be integrated within a larger circuit.

When referring to the drawings in the following detailed description, spatial references "top," "bottom," "upper," "lower," "vertical," "horizontal," and the like may be used. Such references are used for teaching purposes, and are not intended as absolute references for embodied devices. An embodied device may be oriented spatially in any suitable manner that may be different from the orientations shown in the drawings. The drawings are not intended to limit the scope of the present teachings in any way.

Features and advantages of the illustrated embodiments will become more apparent from the detailed description set forth below when taken in conjunction with the drawings.

DETAILED DESCRIPTION

As described above, transistors comprising gallium nitride material are useful for high-speed, high-voltage, and high-power applications because of the favorable material properties of gallium nitride. Some of these applications can place demanding performance requirements on devices that include gallium-nitride transistors. The inventors have recognized and appreciated that proper second-harmonic termination at a transistor's input can increase the device's peak drain efficiency (DE) and potentially increase peak output power. Further, proper second-harmonic termination, via an input network can improve a transistor's usefulness for power amplifier architectures that include, but are not limited to, class-J, class-F, inverse class-F, class-AB, and Doherty amplifiers. The inventors have recognized and appreciated that an input network can be integrated in a package with the transistor, and a two-stage method may be used to better suppress second harmonic generation and match the device's input impedance to a target value.

Figure 1A:
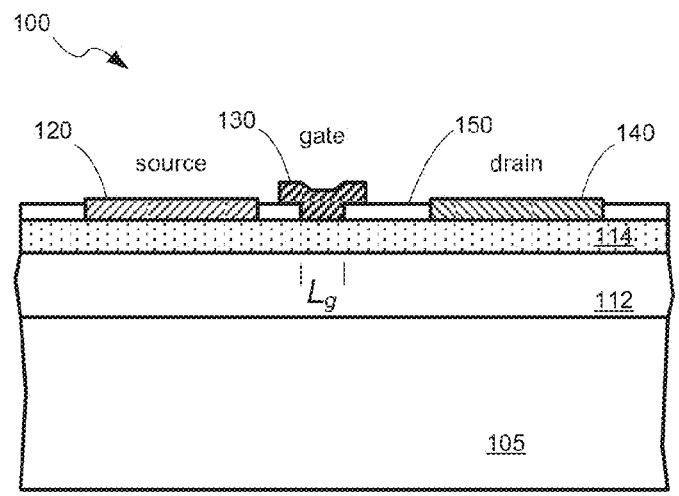
FIG. 1A is an elevation view of structure of a field-effect transistor comprising gallium-nitride material, according to some embodiments.
Figure 1B:
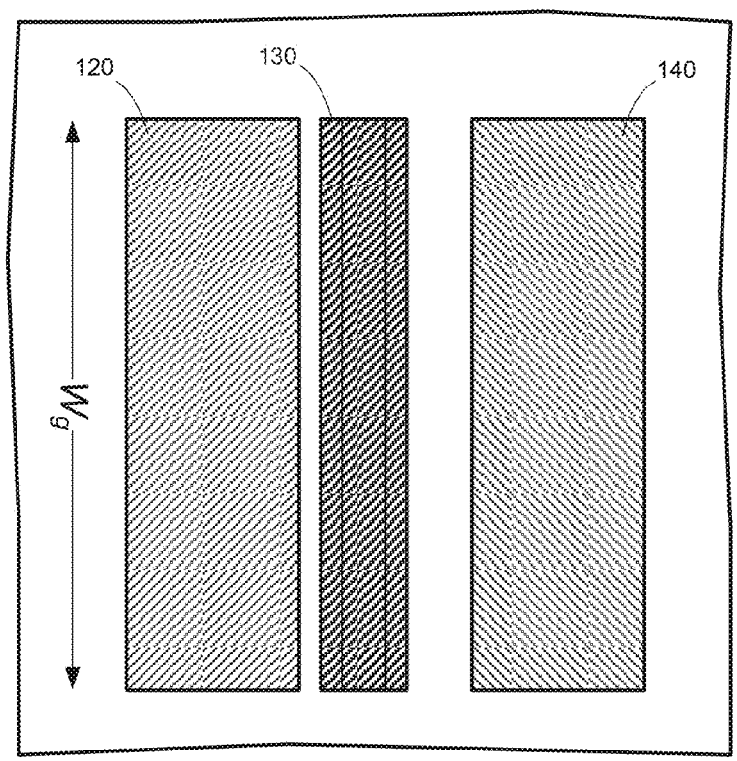
FIG. 1B depicts a plan view of a field-effect transistor comprising gallium-nitride material, according to some embodiments.

By way of introductory explanation, FIG. 1A and FIG. 1B depict an example of a single field-effect transistor 100 that may be included in embodiments described below. A transistor may be formed from one or more gallium-nitride layers 114, 112 on a substrate 105. A transistor 100 may include one or more source contacts 120, one or more gate contacts 130, and one or more drain contacts 140. One or more passivation layers 150 may be deposited on the transistor. A width $W_g$ of the gate may be between approximately 10 microns (μm) and approximately 2 millimeters (mm) A length of the channel $L_g$ may be between approximately 0.02 μm and approximately 1.0 μm.

When using the terms "on," "adjacent," or "over" in to describe the locations of layers or structures, there may or may not be one or more layers of material between the described layer and an underlying layer that the layer is described as being on, adjacent to, or over. When a layer is described as being "directly" or "immediately" on, adjacent to, or over another layer, no intervening layer is present. When a layer is described as being "on" or "over" another layer or substrate, it may cover the entire layer or substrate, or a portion of the layer or substrate. The terms "on" and "over" are used for ease of explanation relative to the illustrations, and are not intended as absolute directional references. A device may be manufactured and implemented in other orientations than shown in the drawing (for example, rotated about a horizontal axis by more than 90 degrees.

In some implementations, a transistor 100 is formed as a depletion-mode, high-electron-mobility transistor (HEMT). In some embodiments, the transistor 100 may be formed as a junction field-effect transistor (JFET). Other transistor architectures may be used in other embodiments. Other transistor architectures may include, but not be limited to, metal-oxide-semiconductor field-effect transistor (MOSFET) and metal-insulator-semiconductor field-effect transistor (MISFET).

According to some embodiments, the substrate 105 may comprise bulk GaN, although bulk GaN can be expensive to manufacture. In preferred implementations, the substrate may comprise silicon. For example, the substrate may be a bulk monocrystalline silicon substrate or monocrystalline silicon-on-insulator (SOI). In some embodiments, the substrate 105 may comprise sapphire or silicon carbide. The substrate 105 may be in the form of a wafer (e.g., a Si semiconductor wafer) and have a diameter between approximately 50 mm and approximately 450 mm In various embodiments, the surface of the substrate is monocrystalline, so that III-nitride material may be epitaxially grown from the surface of the substrate. According to some embodiments, a silicon substrate may comprise a high resistivity silicon layer or region. As used herein, high resistivity is defined as greater than 100 ohm-cm, greater than 1000 ohm-cm or even greater than 10,000 ohm-cm. In other embodiments, the silicon substrate may be comprised of floatzone silicon (111), or comprised of magnetic Czochralski (MCZ) silicon (111). The substrate 105 may be approximately 1-mm thick, less than 725 microns thick, less than 675 microns thick, less than 625 microns thick, less than approximately 150 microns thick, or less than approximately 50 microns thick.

Because of the lattice mismatch between the substrate and a gallium-nitride layer 114, one or more transitional layers 112 may be formed on the substrate. The transitional layers 112 may include a buffer layer (e.g., AlN) deposited directly on or above the substrate 105 followed by one or more gallium nitride material layers deposited on the buffer layer. Examples of transitional layers 112 are described in, for example, U.S. Pat. No. 7,135,720 and U.S. Pat. No. 9,064,775, which are both incorporated herein by reference in their entirety.

As used herein, the phrase "gallium nitride material" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_x In_y Ga_{(1-x-y)}N$), gallium arsenide phosporide nitride ($GaAs_xP_y N_{(1-x-y)}$), aluminum indium gallium arsenide phosporide nitride ($Al_x In_y Ga_{(1-x-y)} As_a P_b N_{(1-a-b)}$), amongst others. Typically, when present, arsenic and/or phosphorous are at low concentrations (i.e., less than 5 percent by weight). In certain preferred embodiments, the gallium nitride material has a high concentration of gallium and includes little or no amounts of aluminum and/or indium. In high gallium concentration embodiments, the sum of (x+y) may be less than 0.4 in some implementations, less than 0.2 in some implementations, less than 0.1 in some implementations, or even less in other implementations. In some cases, it is preferable for at least one gallium nitride material layer to have a composition of GaN (i.e., x=y=a=b=0). For example, an active layer in which a transistor channel is formed may have a composition of GaN. Gallium nitride materials may be doped n-type or p-type, or may be intrinsic. Suitable gallium nitride materials are described in U.S. Pat. No. 6,649,287, which is incorporated herein by reference in its entirety. In some implementations, it is preferable for at least one gallium nitride layer to be comprised of one or more device layers, including for example, a channel layer, a barrier layer formed over the channel layer, a back barrier layer formed below the channel layer, a spacer layer or interlayer formed between the barrier layer and channel layer, and/or one or more capping layers formed over the barrier layer. It may be also preferred that the device layers form a high electron mobility transistor (HEMT) comprising a two dimensional electron gas (2DEG) and/or two dimension hole gas (2DHG) located at the interface regions of the barrier (backbarrier) and channel device layers. In some cases, the HEMT may be a depletion mode (normally ON) or enhancement mode (normally OFF) transistor.

According to some embodiments, a transistor 100 comprises a gallium-nitride material layer 114 which includes source, channel, and drain regions below the source, gate, and drain contacts. Carrier transport between the source and drain in the gallium-nitride material layer 114 is controlled by voltage applied to the gate contact 130. Because the gallium-nitride material layer 114 includes the active region of the device, it may have a low defect density that is typical for integrated-circuit-grade GaN. For example the defect density may be less than approximately $10^9$ $cm^{-2}$ in some implementations, and less than approximately $10^8$ $cm^{-2}$ in some embodiments. Defect densities may be higher in the transition layer 112. A thickness of the gallium-nitride material layer 114 may be between approximately 50 nm and approximately 1500 nm. In some implementations, gallium-nitride material layer 114 has a composition of GaN.

Figure 2A:
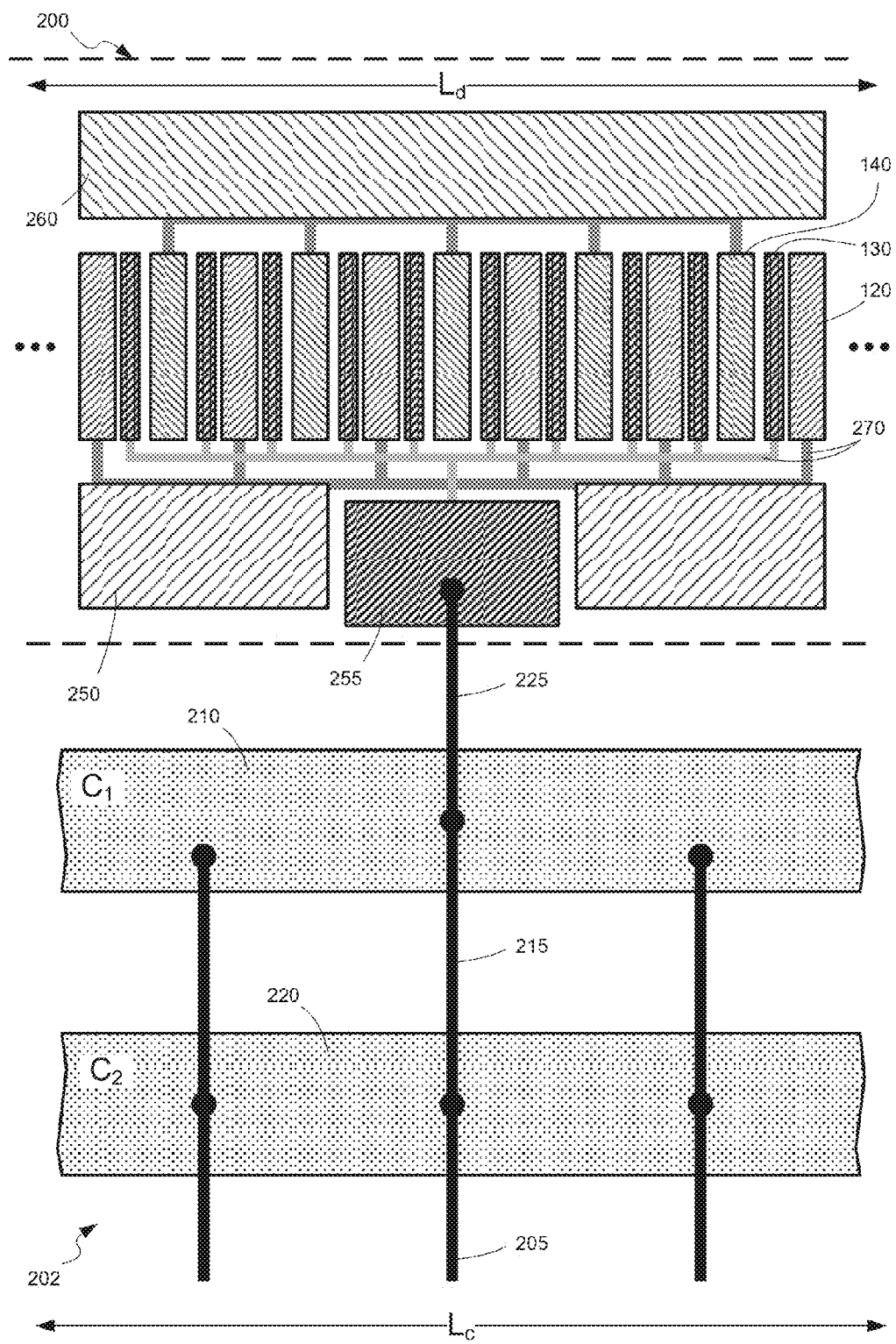
FIG. 2A depicts a plan view of a power transistor comprising gallium nitride material, according to some embodiments.

A plurality of transistors 100, each like that illustrated in FIGS. 1A-1B, may be included in a power transistor 200 that is formed on a semiconductor die, as depicted in FIG. 2A. For example, a plurality of source contacts 120, gate contacts 130, and drain contacts 140 may be formed in a linear array on an underlying gallium-nitride material layer. The number of source, gate, and drain contacts in the array may determine a length $L_d$ of an active region of the power transistor. For example, the length $L_d$ of the active region may be between approximately 1 mm and approximately 50 mm, according to some embodiments. Increasing the number of source, drain, and gate contacts increases, approximately linearly, the amount of power the power transistor may handle. Also, increasing a width of the gates $W_g$ can increase an amount of power the device may handle. In some embodiments, a power density rating per unit length of a power transistor may be specified in terms of a periphery value that is approximately equal to the product of a number of gates used in the transistor and their corresponding gate width $W_g$. According to some implementations, a power density rating for a transistor of the present embodiments is between approximately 1 Watt per millimeter (W/mm) and approximately 15 W/mm where length is in terms of the periphery value.

In some cases, a power transistor may further be defined in terms of the drain voltage $V_{DD}$ applied to the transistor. For example, a power transistor may be designed to safely operate at $V_{DD}$ between 0 V and approximately 28 V. In some cases, a power transistor may be designed to safely operate at $V_{DD}$ between 0 V and approximately 50 V. In other cases, a power transistor may be designed to operate safely at $V_{DD}$~50 V or more. In some embodiments, a power density rating per unit length of a power transistor may be specified in terms of a periphery value and the operating drain voltage applied to power transistor.

There may be a number of metal interconnects 270 patterned over the substrate 105 that connect the gate, source, and drain contacts to corresponding gate pads 255, source pads 250, and drain pads 260 located on the die. The interconnects 270 may be formed on multiple levels. There may be a plurality of gate pads, source pads, and drain pads formed along a length of the power transistor adjacent to the gate, source, and drain contacts of the individual transistors. The gate pads, source pads, and drain pads may be sized to permit wire bonding to other circuit components. For example, the pads may be at least 20 microns in length on a side. The pads, interconnects, and contacts may comprise metal (e.g. gold, copper, aluminum) or a combination of metals. In some embodiments, a thin adhesion layer (e.g., titanium or chrome) may be deposited on a layer before depositing a more conductive material, such as gold, copper, nickel, or aluminum, for a pad. In some implementations, the electrodes may be connected to conductive elements. For example, the source electrodes, drain electrodes and/or gate electrodes may be connected to field plates. In addition, in some cases, the pads or electrodes may be connected electrically to through-wafer conductive vias, for example, to connect the source of the transistor to ground through a conductive source via and back-metal layer formed on the backside of the substrate.

Figure 2B:
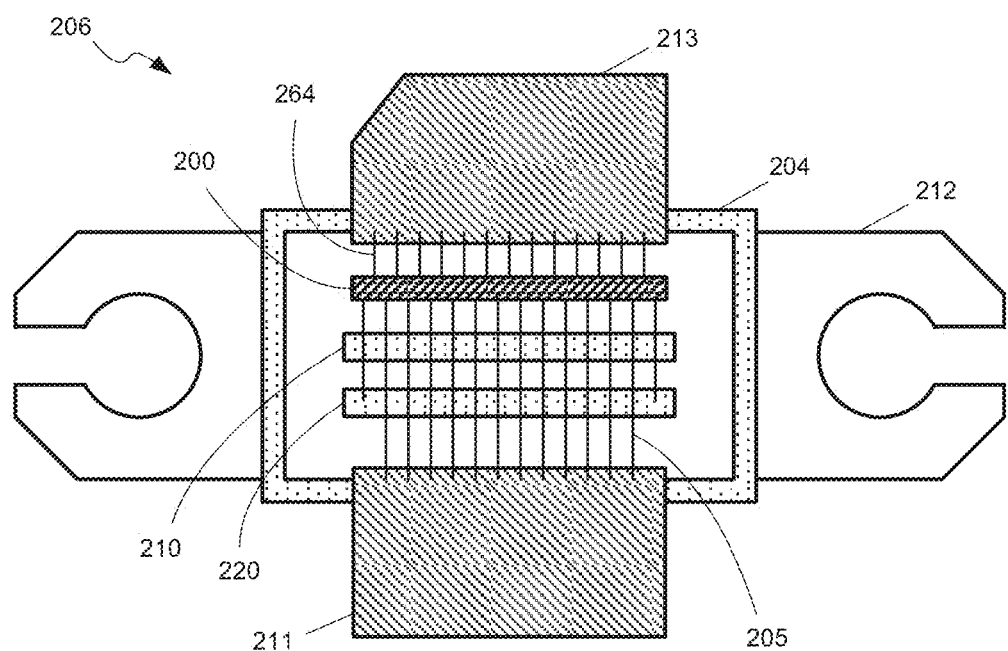
FIG. 2B is a cut-away plan view depiction of a packaged power transistor comprising gallium nitride material, according to some embodiments.

A packaged power transistor may include a plurality of bond wires 225 connected to the gate pads, as depicted in FIG. 2A. There may be additional bond wires connected to source pads and drain pads. There may be more than one bond wire connected to a pad. For example, there may be a plurality of bond wires 264 connected to drain pad 260 and spaced apart on a regular pitch, as illustrated in FIG. 2B. In some cases, the bond wires may be spaced on an irregular pitch. The pitch of bond wires connected to the pads may be between approximately 100 microns and approximately 0.5 mm. The pitch of bond wires connecting to the gate pads may be the same as or different than the pitches of bond wires connecting to the source and drain pads. The bond wires may comprise gold or any other suitable metal, and may provide electrical connection to a corresponding source, drain, or gate lead of a package in which the power transistor is housed. In some implementations, the bond wires may be connected to the bond pads using a ball bond or wedge bond for example. In some cases, ribbon bonds may be used instead of, or in addition to, bond wires.

According to some embodiments, a packaged power transistor 206 may include a power transistor 200 and an input matching network 202 that is configured to transform impedance at a fundamental operating frequency of the power transistor and to reduce or terminate power at the second harmonic of the fundamental frequency. A packaged power transistor 206 may be tuned via adjusting components of the input matching network for a particular operating frequency. An operating frequency may be between approximately 500 MHz and approximately 6 GHz, according to some implementations, or may be between approximately 1 GHz and approximately 6 GHz.

In some embodiments, an input matching network 202 may comprise a second capacitor $C_2$ 220 and first capacitor $C_1$ 210 connected to gate pads 255 of the power transistor 200, as depicted in FIGS. 2A-2B. In some implementations, the capacitors may comprise integrated capacitors formed on silicon. In some implementations, the capacitors may comprise integrated capacitors formed on gallium-arsenide. Radio-frequency signals (or other high-frequency signals) applied to a gate terminal 211 of the packaged power transistor 206 may couple to the gate pads 255 via the first and second capacitors and interconnecting bond wires. In some implementations, additional components may be included in the input matching network (e.g., integrated passive devices). Additionally, parasitic impedance from the package materials and geometry of the package and component lay-out may affect and contribute to the input matching network 202.

There may be a plurality of bond wires 215, with associated inductance, that connect an electrode of the second capacitor 220 to an electrode of the first capacitor 210. Additionally, there may be a plurality of bond wires 205 that connect the second capacitor 220 to an input terminal of the power transistor package (e.g., to a gate lead or pin). The pitch of bond wires 225 connecting to the gate pads may be the same as or different than the pitch of bond wires 215 connecting the two capacitors and the pitch of bond wires 205 connecting the second capacitor to a package lead.

FIG. 2A shows only a portion of a power transistor, according to some embodiments. The power transistor may extend farther along the length direction $L_d$ than illustrated. For example, the illustrated structure may be repeated. The first and second capacitors may extend farther than is illustrated, alongside the gate and source pads of the device. The length of the capacitors may be greater than, approximately equal to, or less than the length $L_d$ of the transistor's active region. According to some implementations, the capacitance of the first and second capacitors 210, 220 is approximately linearly proportional to the active region length $L_d$. The capacitance per unit length (in the direction of $L_d$) of the first capacitor may be between approximately 1 picofarad/mm (pF/mm) and approximately 10 pF/mm, according to some embodiments. The capacitance per unit length of the second capacitor may be between approximately 1 pF/mm and approximately 20 pF/mm, according to some embodiments. In some cases, a value of the first capacitor 210 may be between approximately 5 pF and approximately 60 pF. In some cases, a value of the second capacitor 220 may be between approximately 5 pF and approximately 60 pF.

FIG. 2B depicts a cut-away view of a packaged power transistor 206, according to some embodiments. The second capacitor 220 may connect via bond wires 205 to a first fin-shaped gate input terminal 211 of the power transistor, according to some embodiments. A conductive mount 212 may serve as a source contact and connect to source pads 250 via bond wires or conductive through-wafer source vias (not shown). The drain pad 260 may connect via bond wires 264 to a drain terminal 213 of the packaged power transistor 206. The drain terminal may also be fin shaped. In some embodiments, a packaged power transistor 206 may further include an output matching network (not shown) connected between one or more drain pads 260 and the drain terminal 213. An output matching network may comprise a shunt capacitor and bond wires or ribbon bonds connecting an electrode of the capacitor to the drain pads 260 and drain terminal. The die comprising the power transistor 200 and the two-capacitor input matching network may be packaged in a metal-ceramic enclosure 204, according to some embodiments. In some cases, the enclosure 204 may comprise plastic, or the packaging may comprise a plastic overmold enclosure. In some implementations, a package may comprise a ceramic air-cavity, a plastic air-cavity, or plastic over-mold package.

Figure 2C:
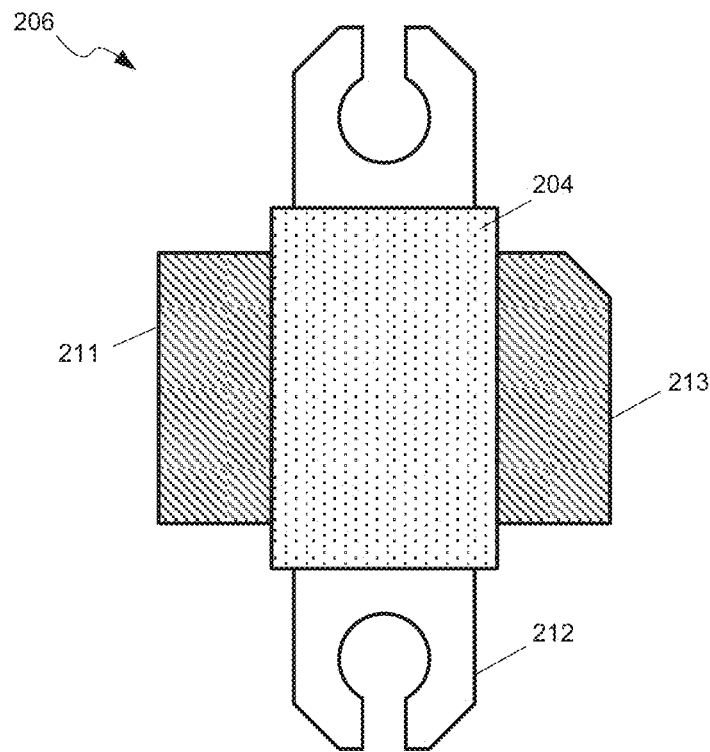
FIG. 2C depicts a plan view of a packaged power transistor, according to some embodiments.
Figure 2D:
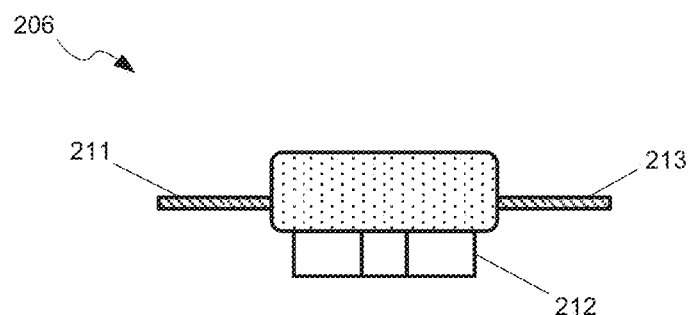
FIG. 2D depicts an end-on elevation view of a packaged power transistor, according to some embodiments.

FIGS. 2C-2D depict additional views of a packaged power transistor 206, according to some embodiments. It is noted that although FIG. 2C represents one exemplary embodiment of the present invention, other packaged configurations consisting of two or more gallium-nitride-based transistors 200, each with their corresponding matching networks 202 (elements 210, 220 and bond wires), may be implemented to scale a packaged product to higher output power levels.

As noted above, a packaged power transistor 206 may be tuned for a desired application by adjusting components of the input matching network 202 (e.g., by selecting capacitance values for at least the first and second capacitors $C_1$ and $C_2$). In some embodiments, an application may have a desired or target operating frequency or frequency range (e.g., a carrier frequency for wireless communications or radar) and a target operating power. Achieving a target power may comprise selecting an active region length $L_d$ and/or individual transistor gate width $W_g$. In some implementations, a target operating power may be met by assembling plural packaged power transistors 206 onto a same device board. For example, a plurality of power transistors (packaged or unpackaged) may be assembled on a same circuit board and configured to operate in parallel on an input signal as a single power transistor.

The inventors have recognized and appreciated that a packaged power transistor 206 can be tuned for a target operating frequency using a two-stage process in which the values of the first and second capacitors $C_1$, $C_2$ are tuned separately. The tuning process may be performed with the assistance of numerical simulation or using empirical methods. For example, tuning may be implemented using a software tool such as Advanced Design System (ADS) available from Keysight Technologies, Inc. of Santa Rosa, Calif. Other suitable software tools include, but are not limited to NI AWR Design Environment available from AWR Corporation of El Segundo, Calif. and Sonnet® software tools available from Sonnet Software of North Syracuse, N.Y. In some cases, the tuning procedure may be iterated before selecting values of capacitances for the first and second capacitors.

Figure 3A:
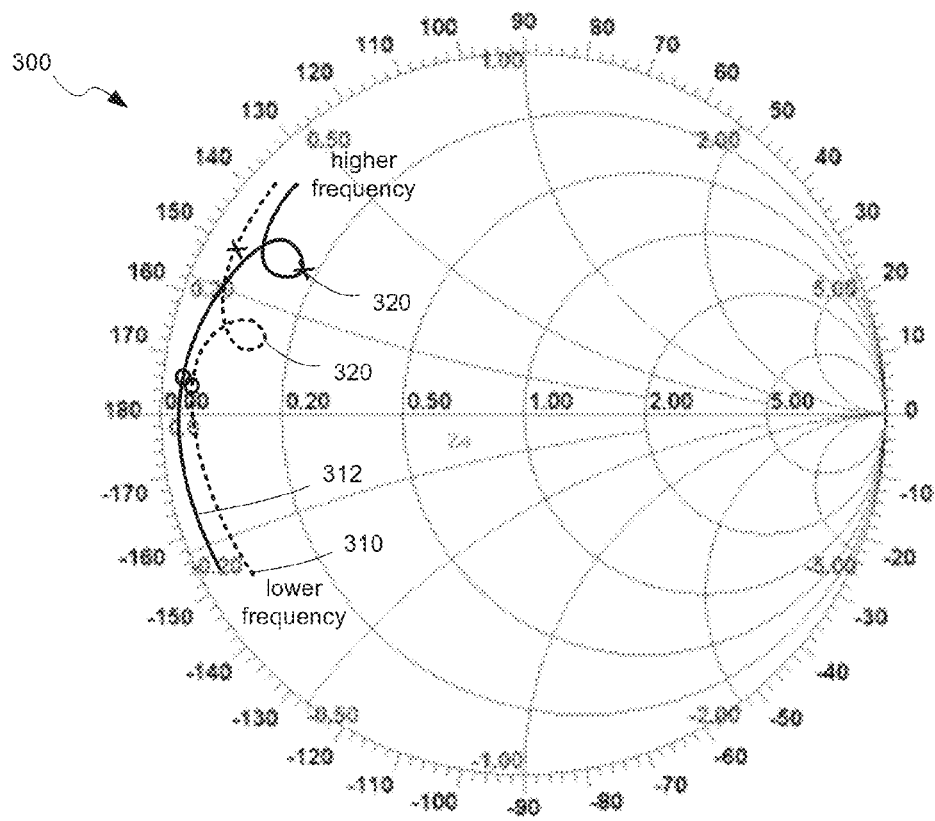
FIG. 3A is a Smith chart illustrating second-harmonic tuning curves for a semiconductor transistor, according to some embodiments.

In a first stage of design, a scattering-parameter $S_{11}$ curve for a portion of the transistor and input matching network is determined over a range of frequencies that span a target operating frequency or operating frequency range for the transistor. In this first stage, a first capacitive shunt comprising the first capacitor $C_1$ is connected to at least one gate pad 255 of the transistor 200, but the second capacitor $C_2$ is absent or not yet connected. Additionally, the gate-to-source capacitance $C_{gs}$ is included when determining the $S_{11}$ curve. As an example, an input signal may be applied to a gate lead of the packaged device and the frequency swept over any range between about 0.5 GHz and about 10 GHz. The $S_{11}$ scattering-parameter curve 310 of the resulting circuit may then be determined and plotted on a Smith chart 300, as depicted in FIG. 3A. The $S_{11}$ parameter represents an amount of a signal applied to an input port (e.g., the first capacitive shunt or a gate lead of the packaged transistor) that is reflected or coupled back from the power transistor.

Figure 3B:
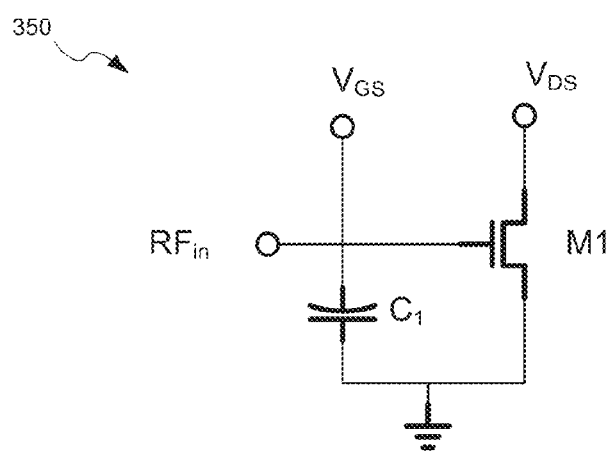
FIG. 3B is a crude circuit schematic showing an input network and semiconductor transistor corresponding to the tuning curve of FIG. 3A, according to some embodiments.

For purposes of explanation, a crude circuit model for the portion of the power transistor used for the first stage of design may include elements as configured in the circuit 350 of FIG. 3B. A first capacitive shunt comprising capacitor $C_1$ is connected to at least one gate pad 255. Additional elements may be included in a full circuit model (e.g., inductance due to bond wires between the RF input and gate of transistor M1, parasitic capacitances between gate and source and gate and drain of transistor M1, parasitic package impedance, etc.). In some implementations, $S_{11}$ parameter values over a range of trial frequencies may be computed numerically from a full circuit model for several capacitance values $C_1$. When determining $S_{11}$, a gate bias voltage $V_{GS}$ may be applied to the gate terminal of power transistor to bias the transistor at its targeted quiescent operating point.

An $S_{11}$ 310 curve for a trial capacitive value may exhibit a resonance loop 320, as shown in the Smith chart of FIG. 3A. To tune the amplifier to a target frequency, the value of the first capacitor $C_1$ and/or one or more structural aspects of the bond wires 225 (number, size, length, material, spacing, straightness) may be altered while the location of the resonance loop 320 is tracked. The inventors have found that changing the value of the first capacitor and/or changing aspects of the bond wires can change the location in frequency of the resonance loop 320. The inventors have recognized and appreciated that a packaged power transistor 206 will exhibit improved drain efficiency (by up to 10% increase or more) when a peak of the resonance loop is located at approximately twice the target frequency of the power transistor. A target frequency is indicated by the "O" symbols in FIG. 3A, and twice the target frequency is indicated by the "X" symbols. Accordingly, the value of the first capacitor $C_1$ may be adjusted until the resonant loop peak moves to approximately twice the target frequency of the packaged power transistor 206. Adjusting the value of capacitor $C_1$ may move the resonance peak to a higher frequency, as depicted by the second $S_{11}$ curve 312. For example, if a target frequency for a power transistor is 2.5 GHz, then the value of the first capacitor $C_1$ may be adjusted until the resonant loop peak is located at approximately 5 GHz.

In some embodiments, a target frequency for which a transistor and input matching network is tuned may be a target operating frequency for the final packaged device. In some implementations, a target frequency may be a frequency value at an upper limit of a specified frequency range over which the packaged device is to operate.

In a second stage of tuning, a second capacitive shunt including the second capacitor $C_2$ is included in the input network, and the determination of $S_{11}$ repeated. The value of $C_2$ may be adjusted to obtain a desired matching input impedance of the packaged power transistor at the target frequency. In some implementations, other elements affecting impedance between the gate lead of the packaged transistor and first capacitive shunt may also be adjusted. Other elements may include bond wires (e.g., changing a number of bond wires), integrated passive devices, and package geometry and/or material.

Figure 4A:
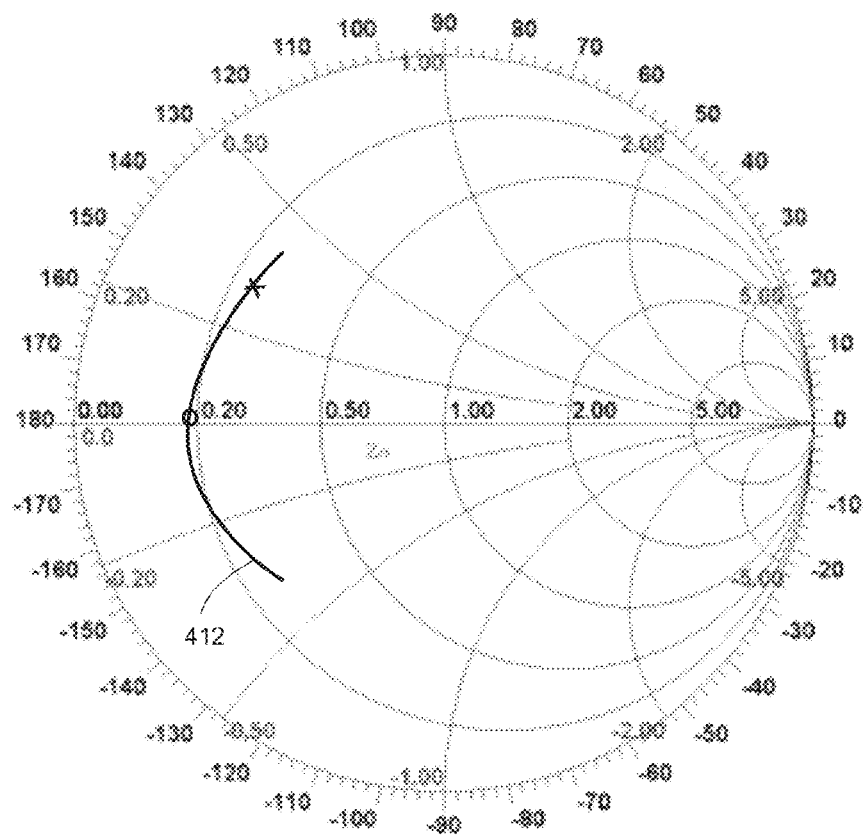
FIG. 4A is a Smith chart illustrating an impedance-matching curve for a power transistor, according to some embodiments.
Figure 4B:
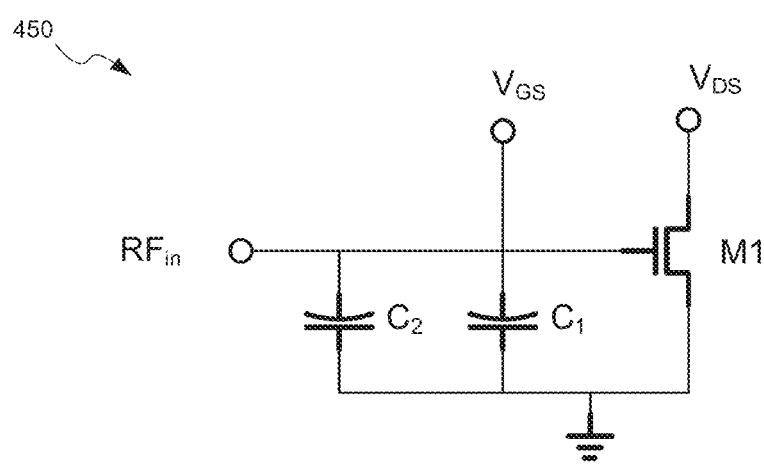
FIG. 4B is a circuit schematic showing a two capacitor input network for a transistor corresponding to the tuning curve of FIG. 4A, according to some embodiments.

As just one example, an application may require an input impedance of the packaged transistor to be 10 ohms. Accordingly, the second capacitor and other elements may be adjusted until the corresponding $S_{11}$ curve 412 shows an input impedance of approximately 10 ohms at the fundamental or target frequency, as depicted in FIG. 4A. A crude circuit model for the packaged power transistor used for the second stage of design may include elements as configured in the circuit 450 of FIG. 4B. A second capacitive shunt including the second capacitor $C_2$ may be connected to the first capacitive shunt. The circuit model does not show inductances associated with bond wires, parasitic capacitances, or parasitic impedances, which may be included in a full circuit model of the input matching network.

According to some embodiments, one or more iterations of adjusting capacitance values in the first tuning stage and second tuning stage may be employed to better position the resonance loop and match input impedance of a packaged power transistor 206. During an iteration, the second capacitor may remain connected to the input network. In some cases, capacitances and other values may be adjusted to obtain a targeted real input impedance. The targeted input impedance may be between 0 ohms and approximately 100 ohms. An input impedance may be matched to within ±10%, according to some embodiments.

Figure 5:
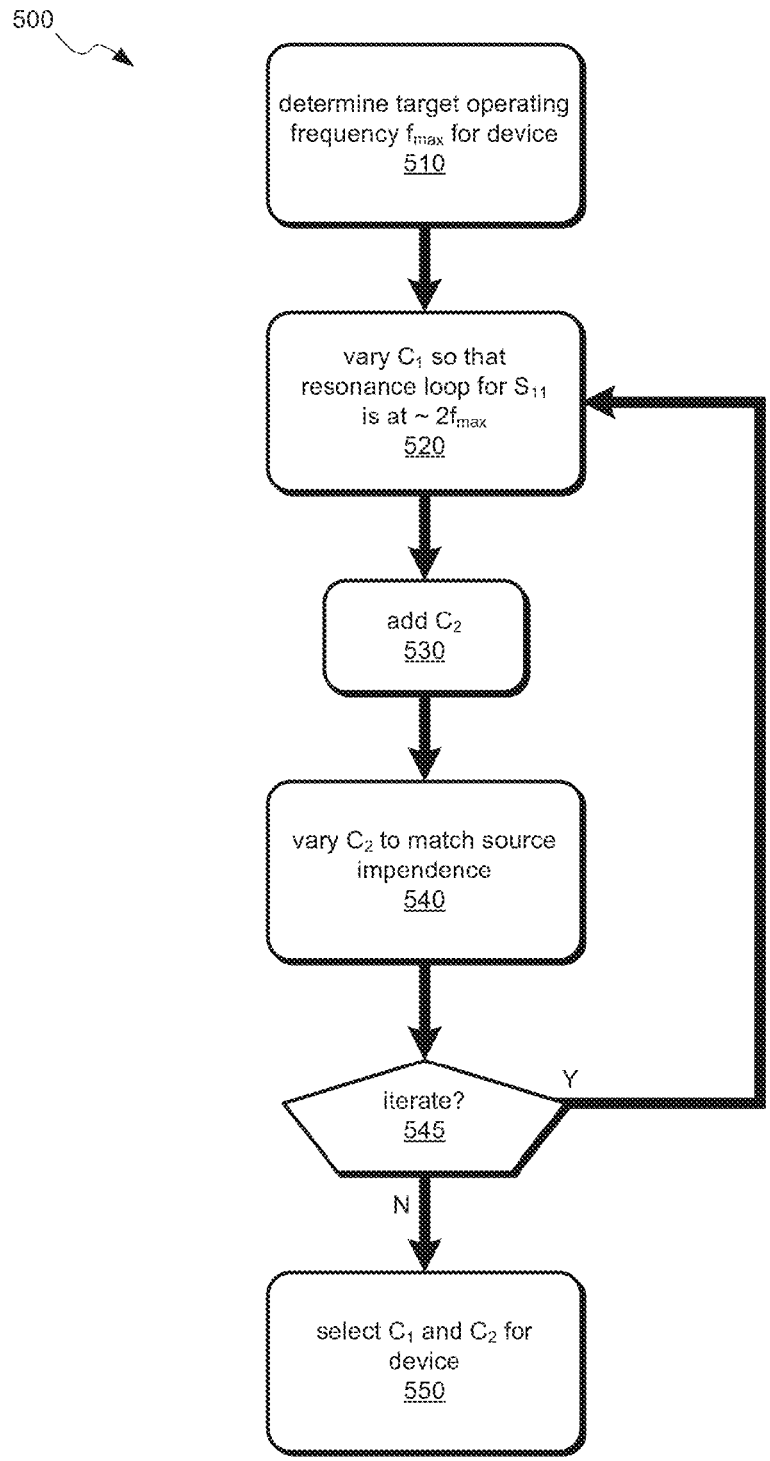
FIG. 5 depicts a method for tuning a power transistor, according to some embodiments.

FIG. 5 depicts a flow chart of acts associated with a method 500 for tuning a packaged power transistor, according to some embodiments. A method of tuning the amplifier may comprise determining (step 510) a target frequency for a power transistor. In some implementations, a customer may specify a target frequency for a particular application. In some cases, a particular application may require a target frequency to lie within a certain range (e.g., to meet wireless communication protocols). A designer may determine the target frequency based upon the needs of a particular application.

A method 500 may further comprise acts of varying (step 520) values of a capacitor $C_1$ in a first capacitive shunt connected to at least one gate contact of the power transistor while determining $S_{11}$ curves for the circuit without the second capacitor $C_2$ present. $C_1$ may be varied until a resonance loop of the $S_{11}$ curve is located at approximately twice the target frequency determined in step 510. Subsequently, a second capacitive shunt including the second capacitor $C_2$ may be added (step 530) to the input matching network (e.g., connected to the first capacitive shunt).

The method 500 may further include varying (step 540) the value of the second capacitor $C_2$ to impedance match the input of the packaged power transistor. Step 540 may comprise varying $C_1$ while determining $S_{11}$ curves for the circuit, from which an input impedance can be determined. In some embodiments, the desired input impedance may be selected for a particular application. For example, a customer may specify an output impedance of a device that will drive the power transistor, and a designer may match the input impedance to the specified output impedance. In some implementations, the input impedance may be selected to be a common value, e.g., 50 ohms.

In some implementations, a method may comprise determining (step 545) whether it is necessary to iterate the tuning process. If it is determined that tuning needs to be iterated, at least the act of varying (step 520) the first capacitor $C_1$ may be repeated while $C_2$ is connected. In some case, the act of varying (step 540) the second capacitance may also be repeated.

According to some embodiments, a method 500 for tuning a packaged power transistor may comprise selecting the values for the two input capacitors $C_1$ and $C_2$ that provide an $S_{11}$ resonance loop at approximately twice the target frequency (without $C_2$ present in the circuit), and transform the input impedance of the packaged transistor to a desired matching impedance (by adding a second capacitive shunt with capacitor $C_2$). A plurality of packaged power transistors may then be fabricated with the selected values of input capacitances.

The inventors have recognized and appreciated that tuning the input network of a power transistor as described above can increase the drain efficiency of the packaged transistor appreciably. For example, the tuning can yield drain efficiencies between 50% and 55% in some embodiments, between 55% and 60% in some embodiments, between 60% and 65% in some embodiments, and yet between 65% and 75% in some embodiments. In some cases, the tuning can provide peak drain efficiencies between approximately 65% and approximately 80% at frequencies up to approximately 3.8 GHz. In some embodiments, tuning the input network can provide peak drain efficiencies between approximately 65% and approximately 80% at frequencies up to approximately 6 GHz.

Although the above structures, circuits, and methods have been described primarily for gallium-nitride transistors, other semiconductor materials may be used in other embodiments of high-speed transistors. Some embodiments may include heterojunction transistors comprising SiC, SiGe, GaAs, InP, and CdTe.

EXAMPLE

Figure 6A:
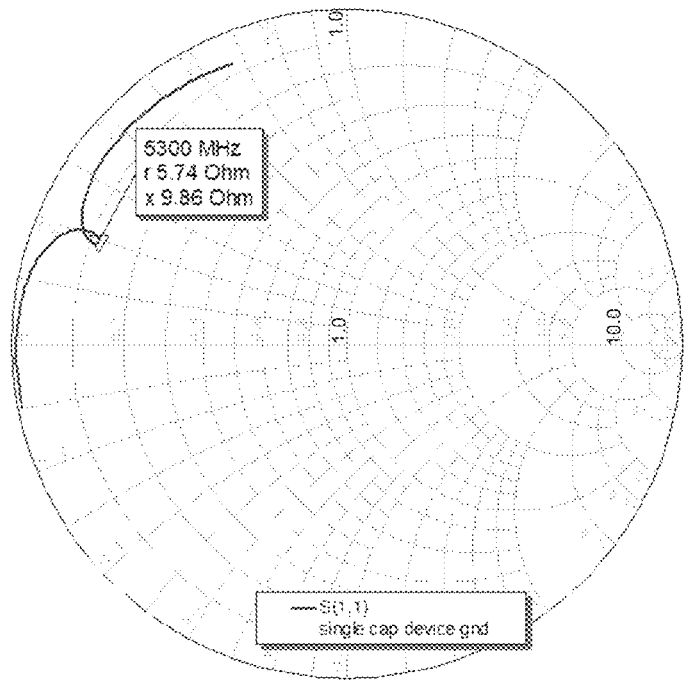
FIG. 6A shows an example of the gate terminal input impedance trajectory as seen from outside the package looking into the gate lead of the device for a gallium-nitride transistor during a first stage of tuning.

This example illustrates a tuning process for one embodiment of a gallium-nitride power transistor. The transistor package was similar to that depicted in FIG. 2B, and the periphery value for the active region of the transistor was approximately 24.2 mm. Twelve bond wires were connected between gate pads 255 of the transistor and a first capacitor $C_1$ of a first capacitive shunt. The first capacitive shunt was located off die, but within the transistor package. The bond wires were spaced on a pitch of approximately 380 microns. The bond wires were gold having a diameter of approximately 25 microns. In the first stage of tuning, the capacitor $C_1$ was adjusted to locate the resonance loop peak 320 of the $S_{11}$ curve at approximately 5300 MHz, as depicted in FIG. 6A. The gate-to-source capacitance $C_{gs}$ was included in the model. The value of capacitor $C_1$ was selected to be 20 pF.

Figure 6B:
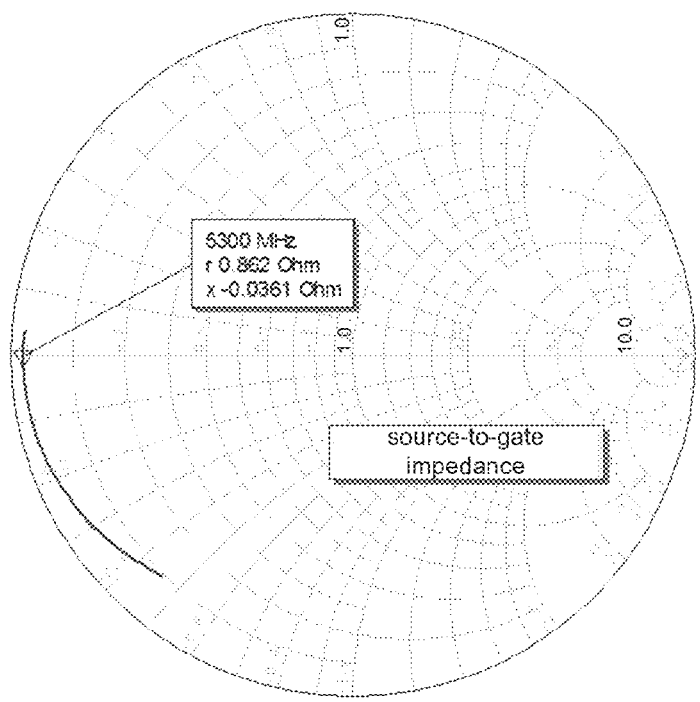
FIG. 6B shows an impedance trajectory as seen from a GaN FET source terminal 212 up thru the gate pad 255 of the FET to the single capacitor network with packaged device gate terminal terminated into a 50 ohm load.

For reference, the source-terminal impedance curve (which provides a measure of impedance looking from the source terminal 212 thru the gate pads 255 toward the gate lead) of the power transistor, looking back into the first capacitive shunt, was determined during the first stage of tuning. A source-terminal impedance curve is shown in FIG. 6B. The combination of $C_{gs}$, bond wires, capacitor and package for this example provide a source-terminal impedance that is near zero ohms (short) at 5.3 GHz, the second harmonic of the target frequency.

Figure 7A:
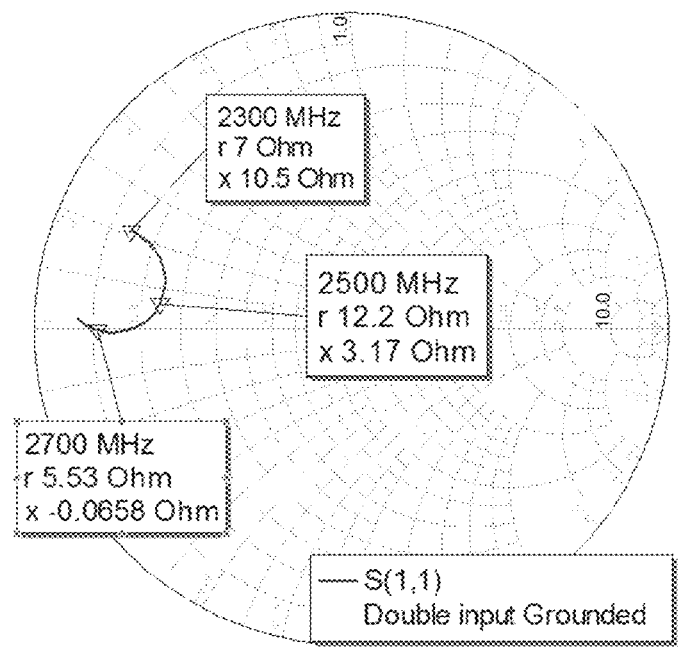
FIG. 7A shows an example of the gate terminal 211 input impedance trajectory as seen from outside the package looking into the gate lead of the device for a gallium-nitride transistor during a second stage of tuning.
Figure 7B:
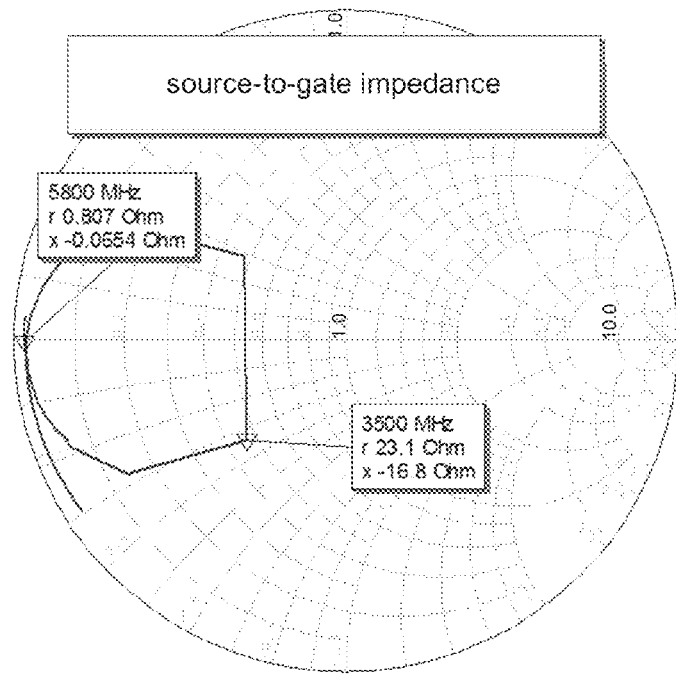
FIG. 7B shows an impedance trajectory as seen from the GaN FET source terminal 212 up thru the gate pad 255 of the FET to the double capacitor network with packaged device gate terminal terminated into a 50 ohm load.

In the second stage of tuning, a second capacitive shunt including the second capacitor $C_2$ was added to the input network and the $S_{11}$ curve determined again as the capacitance of $C_2$ was varied. A desired impedance of approximately 5 ohms was found at the fundamental frequency when $C_2$ was selected to be 20 pF, as depicted in FIG. 7A. For reference, the source-terminal impedance curve (which provides a measure of impedance looking from the source terminal 212 through the gate pads 255 toward the gate lead) was determined for the two-capacitor network, and is shown in FIG. 7B. The curve shows a near-zero impedance (short) at approximately the second harmonic frequency. The inventors have found that such a low impedance at the second harmonic implies that the packaged transistor will provide improved drain efficiency at the fundamental operating frequency. For this device, the drain efficiency increased from about 63% to about 70% with the tuned two-capacitor input network.

CONCLUSION

The terms "approximately" and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately" and "about" may include the target dimension.

The technology described herein may be embodied as a method, of which at least some acts have been described. The acts performed as part of the method may be ordered in any suitable way. Accordingly, embodiments may be constructed in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A power transistor comprising:
a plurality of semiconductor transistors connected in parallel;
a first capacitive shunt connected to gate contacts of the semiconductor transistors; and
a second capacitive shunt connected to gate contacts of the semiconductor transistors, wherein a peak of a resonance loop for an $S_{11}$ scattering-parameter curve determined at an input node that is common to an electrode of the first capacitive shunt and looking toward the power transistor and with the second capacitive shunt disconnected is at a frequency that is approximately twice a target frequency for the power transistor.

2. The power transistor of claim 1, wherein the plurality of semiconductor transistors comprise a plurality of gallium-nitride transistors integrated onto a die.

3. The power transistor of claim 2, wherein the first capacitive shunt comprises:
a first bar capacitor having a capacitance between approximately 5 pF and approximately 60 pF; and
a first plurality of bond wires connected between an electrode of the first bar capacitor and gate pads of the plurality of transistors.

4. The power transistor of claim 3, wherein the second capacitive shunt comprises:
a second bar capacitor having a capacitance between approximately 5 pF and approximately 60 pF; and
a second plurality of bond wires connected between an electrode of the second bar capacitor and the electrode of the first bar capacitor.

5. The power transistor of claim 4, wherein the first and second plurality of bond wires are formed of gold and are spaced between approximately 100 microns and approximately 500 microns apart.

6. The power transistor of claim 3, wherein the bond wires are formed of gold and are spaced between approximately 100 microns and approximately 500 microns apart.

7. The power transistor of claim 2, wherein the plurality of gallium-nitride transistors include a gallium-nitride layer formed over a silicon substrate.

8. The power transistor of claim 7, further comprising at least one transition layer formed between the silicon substrate and the gallium-nitride layer.

9. The power transistor of claim 2, wherein the plurality of gallium-nitride transistors are arranged in a linear array.

10. The power transistor of claim 2, wherein the plurality of gallium-nitride transistors comprise depletion-mode transistors.

11. The power transistor of claim 2, wherein the plurality of gallium-nitride transistors comprise high-electron-mobility transistors.

12. The power transistor of claim 2, wherein a drain efficiency at the target frequency is between approximately 50% and approximately 75%.

13. The power transistor of claim 2, wherein the plurality of gallium-nitride transistors are arranged in a linear array and a power rating per unit length for the power transistor is between approximately 1 W/mm and approximately 15 W/mm.

14. The power transistor of claim 1, further comprising:
a package housing the power transistor and the first and second capacitive shunts; and
a metal lead connected to the second capacitive shunt providing a gate connection to the at least one gate contact.

15. The power transistor of claim 14, wherein a real input impedance for the power transistor is between 0 ohms and approximately 100 ohms.

16. The power transistor of claim 1, wherein the target frequency is between approximately 1 GHz and approximately 6 GHz.

17. The power transistor of claim 1, further comprising an output matching network connected to one or more drain pads of the power transistor.

18. The power transistor of claim 1, further comprising at least one additional passive device connected in an input matching network that includes the first and second capacitive shunts.

19. A method for making at least one power transistor having a two-capacitor input network, the method comprising:
  altering a value of a first capacitor in a first capacitive shunt to obtain a first capacitor value at which a resonance loop of an $S_{11}$ scattering-parameter curve at an input node that is common to an electrode of the first capacitor and looking toward the power transistor has a peak at a frequency that is approximately twice a target frequency for the power transistor, wherein the first capacitive shunt is connected to at least one gate contact of the power transistor;
  adding a second capacitive shunt that is connected to at least one gate contact of the power transistor;
  altering a value of a second capacitor in the second capacitive shunt to obtain a second capacitive value at which an input impedance at an input to the second capacitive shunt is approximately equal to a target impedance value; and
  making at least one power transistor having a first capacitor with the first capacitor value and a second capacitor with the second capacitor value in the two-capacitor input network.

20. The method of claim 19, further comprising connecting an electrode of the second capacitor to an electrode of the first capacitor with a plurality of bond wires.

21. The method of claim 20, further comprising connecting the electrode of the second capacitor to a package gate lead.

22. The method of claim 20, wherein the second capacitor is a bar capacitor.

23. The method of claim 19, further comprising connecting an electrode of the first capacitor to gate pads of the power transistor with a plurality of bond wire connections.

24. The method of claim 23, wherein the first capacitor is a bar capacitor.

25. The method of claim 19, wherein the power transistor comprises gallium nitride in an active region of the transistor.

26. The method of claim 19, wherein the target frequency is between approximately 1 GHz and approximately 6 GHz.

27. The method of claim 19, wherein altering the value of the first capacitor comprises selecting a value of the first capacitor in a range between approximately 5 pF and approximately 60 pF.

28. The method of claim 19, wherein altering the value of the second capacitor comprises selecting a value of the second capacitor in a range between approximately 5 pF and approximately 60 pF.

29. The method of claim 19, further comprising an output matching network connected to one or more drain pads of the power transistor.

30. The method of claim 19, wherein the $S_{11}$ scattering-parameter curve is determined by numerical simulation.

31. The method of claim 19, wherein the $S_{11}$ scattering-parameter curve includes the effect of gate-to-source capacitance ($C_{gs}$).

32. The method of claim 19, wherein the target impedance value comprises between 0 ohms and 100 ohms of real impedance.

33. The method of claim 19, wherein the power transistor comprises one or more depletion-mode transistors disposed in a linear array on a semiconductor die.

34. The method of claim 19, further comprising:
  selecting a first value for the first capacitor;
  selecting a second value for the second capacitor; and
  assembling the power transistor in a package with a first capacitor having the first value and a second capacitor having the second value.

* * * * *